US012638478B2

(12) United States Patent
Jakupi et al.

(10) Patent No.: US 12,638,478 B2
(45) Date of Patent: May 26, 2026

(54) COMPACT CURRENT SENSING FOR PROTECTION AND WIRING DEVICES

(71) Applicant: Schneider Electric USA, Inc., Andover, MA (US)

(72) Inventors: Andi Jakupi, Marion, IA (US); Juan Ignacio Melecio Ramirez, North Liberty, IA (US)

(73) Assignee: Schneider Electric USA, Inc., Boston, MA (US)

( * ) Notice: Subject to any disclaimer, the term of this patent is extended or adjusted under 35 U.S.C. 154(b) by 195 days.

(21) Appl. No.: 18/215,087

(22) Filed: Jun. 27, 2023

(65) Prior Publication Data

US 2024/0142500 A1 May 2, 2024

Related U.S. Application Data

(60) Provisional application No. 63/421,545, filed on Nov. 1, 2022.

(51) Int. Cl.
G01R 19/00 (2006.01)
G01R 33/00 (2006.01)
G01R 33/09 (2006.01)

(52) U.S. Cl.
CPC ..... G01R 19/0092 (2013.01); G01R 33/0023 (2013.01); G01R 33/091 (2013.01)

(58) Field of Classification Search
CPC ............ G01R 19/0092; G01R 33/0023; G01R 33/091; G01R 15/20; G01R 15/202; G01R 15/205; G01R 15/207
See application file for complete search history.

(56) References Cited

U.S. PATENT DOCUMENTS

| | | | | |
|---|---|---|---|---|
| 2013/0015843 A1* | 1/2013 | Doogue | ............... | G01R 15/148 |
| | | | | 324/202 |
| 2013/0020660 A1* | 1/2013 | Milano | ................ | G01R 15/207 |
| | | | | 257/E27.005 |
| 2016/0216342 A1* | 7/2016 | Jost | .................... | G01R 33/0052 |
| 2019/0339307 A1 | 11/2019 | Hebiguchi | | |
| 2020/0025804 A1* | 1/2020 | Bussing | ............... | G01R 15/207 |
| 2020/0300894 A1* | 9/2020 | Brusius | ................ | G01R 15/205 |
| 2020/0328586 A1 | 10/2020 | Eriksen et al. | | |

OTHER PUBLICATIONS

Search Report and Written Opinion for International Application No. PCT/US2023/036132 dated Feb. 28, 2024.

* cited by examiner

*Primary Examiner* — Alvaro E Fortich
(74) *Attorney, Agent, or Firm* — Wolf, Greenfield & Sacks, P.C.

(57) ABSTRACT

Systems and methods for sensing current utilize a coil-less sensor based circuit to detect current. The current sensing circuit includes a first conductive line segment that carries mains AC current, and a second conductive line segment conductively coupled in electrical parallel to the first line segment. The coil-less sensor is mounted between the two conductive line segments proximate to and generally opposite the second conductive line segment. Any suitable coil-less sensor may be used, including Hall effect sensors, tunneling magneto resistive ("TMR") sensors, anisotropic magneto resistive ("AMR") sensors, and other types of sensors that do not use coils to sense current. This arrangement results in two magnetic fields being induced that are additive at the coil-less sensor, which allows the sensor to produce a higher output voltage, thereby providing a more accurate current sensor.

20 Claims, 9 Drawing Sheets

COMPACT CURRENT SENSING FOR PROTECTION AND WIRING DEVICES

CROSS-REFERENCE TO RELATED APPLICATIONS

This application claims the benefit of priority to and incorporates herein by reference U.S. Provisional Application No. 63/421,545, entitled "Compact Current Sensing for Protection and Wiring Devices," filed Nov. 1, 2022.

TECHNICAL FIELD

The present disclosure relates to circuit breakers, wiring devices, and other devices that monitor current flow, and more particularly to systems and methods for sensing current that are much more compact relative to prior solutions.

BACKGROUND

Modern protection devices (e.g., circuit breakers), wiring devices, and other devices that monitor current flow have components that enable a number of functions not previously available in prior devices. For example, a microcontroller in an electronic circuit breaker allows the breaker to function as both a ground fault circuit interrupt (GFCI) device as well as an arc fault circuit interrupt (AFCI) device. The GFCI function can detect conductive paths formed between an ungrounded current carrying conductor and earth ground, while the AFCI function can detect intermittent faults caused by worn or damaged insulation, loose connections, broken conductors, and the like. The microcontroller detects such faults by constantly sensing and sampling line current and monitoring these currents.

In many electronic circuit breakers, the current sensor is a current transformer. This current transformer may be optimally configured for detection of current by adjusting the number of secondary winding turns, or by using a ferrite core, and the like. In some circuit breakers, a di/dt current sensor, also called a "current rate of change" sensor or a "current rise time" sensor or a Rogowski coil, is used instead of a current transformer. The di/dt sensor provides an output signal, which is a voltage signal, that is proportional to the rate of change of its input signal, which is the line current.

However, the use of current transformers, di/dt sensors, and similar types of current sensors presents several design challenges. For one thing, these current sensors occupy a lot of space, making them difficult to incorporate into an already crowded electronic circuit breaker. This is especially true for miniature circuit breakers (MCB) where internal spacing is extremely constrained. Additional challenges often arise due to the increased mechanical complexity that typically accompany these current sensors.

Accordingly, a need exists for a way to reduce the internal spacing required by current sensors within protection devices, wiring devices, and other devices that monitor current flow.

SUMMARY

Embodiments of the present disclosure provide systems and methods for reducing the internal spacing required by current sensors within protection devices, wiring devices, and other devices that monitor current flow. In some embodiments, the systems and methods provide a current flow monitoring device, such as a circuit breaker or a wiring device, that uses a coil-less sensor to detect current.

Examples of coil-less sensors that may be used include a Hall effect sensor, tunneling magneto resistive ("TMR") sensor, anisotropic magneto resistive ("AMR") sensor, and other types of sensors that do not use coils to sense current. The coil-less current sensor can detect the magnetic field generated by a current and provide an output voltage proportional to the detected magnetic field. Such coil-less current sensors are generally well known to those having ordinary skill in the art for their small package size and footprint.

In some embodiments, the current flow monitoring device incorporates the coil-less sensor into a highly compact current sensing circuit that can be used to monitor current flow through the device. The compact current sensing circuit includes two conductive line segments, a first line segment that carries mains AC current, and a second line segment conductively coupled in electrical parallel to the first line segment. The first line segment, or main line segment, may be a bus bar in some embodiments, while the second line segment may be a conductive trace on a printed circuit board (PCB) in some embodiments. The coil-less sensor, which may be a TMR sensor in some embodiments, is then mounted between the two conductive line segments proximate to the second line segment. In these embodiments, the conductive trace is formed on one side of the PCB while the coil-less sensor is mounted on the other side of the PCB generally opposite the conductive trace, with the bus bar extending above the coil-less sensor in electrical parallel to the conductive trace. The conductive trace may have a shape that resembles a letter "S" in some embodiments, such that the middle leg of the "S" carries current parallel to, but in an opposite direction from, current in the bus bar. This arrangement results in two magnetic fields being induced that are additive at the coil-less sensor, which causes the sensor to produce a higher output voltage compared to a single magnetic field from either the bus bar or the conductive trace alone, thereby improving overall sensing accuracy.

In some embodiments, magnetic shielding may be provided for the compact current sensing circuit to reduce electromagnetic noise. The magnetic shielding may have any suitable shape that can block or minimize extraneous electromagnetic fields from interfering with operation of the compact current sensing circuit. Example shielding shapes may include shapes generally resembling a letter "U," such as an opened-top rectangular or oval shape in some embodiments, as well as shapes with closed or partially closed tops, and may be attached to the PCB such that the coil-less sensor, bus bar, and middle leg of the conductive trace are within the shielding in some embodiments. Such shielding may be made of a suitable high permeability material that can help block external magnetic fields from reaching the sensor, bus bar, and middle leg of the conductive trace. The above assembly results in a further improvement to sensing accuracy. The output voltage from the coil-less sensor may then be processed and provided to a controller of the current flow monitoring device to monitor current flow in the device.

In general, in one aspect, embodiments of the present disclosure relate to a compact current sensing circuit. The compact current sensing circuit comprises, among other things, a main conductive line segment, and a second conductive line segment conductively coupled to the main conductive line segment opposite and in electrical parallel to the main conductive line segment. The compact current sensing circuit further comprises a coil-less sensor mounted between the main conductive line segment and the second conductive line segment opposite and proximate to the second conductive line segment. Thereafter, current flowing through the main conductive line segment and the second conductive line segment induces magnetic fields that are additive at the coil-less sensor.

In general, in another aspect, embodiments of the present disclosure relate to a current flow monitoring device. The current flow monitoring device comprises, among other things, a controller and a compact current sensing circuit connected to provide a signal to the controller indicative of a current flowing through the current flow monitoring device. The compact current sensing circuit includes a main conductive line segment, and a second conductive line segment conductively coupled to the main conductive line segment opposite and in electrical parallel to the main conductive line segment. The compact current sensing circuit further includes a coil-less sensor mounted between the main conductive line segment and the second conductive line segment opposite and proximate to the second conductive line segment. Thereafter, current flowing through the main conductive line segment and the second conductive line segment induces magnetic fields that are additive at the coil-less sensor, the coil-less sensor is configured to provide the signal to the controller based on the magnetic fields.

In general, in yet another aspect, embodiments of the present disclosure relate to a method of providing a compact current sensing circuit in a current flow monitoring device. The method comprises, among other things, conductively coupling a main conductive line segment to a second conductive line segment opposite and in electrical parallel to the main conductive line segment. The method further comprises mounting a coil-less sensor between the main conductive line segment and the second conductive line segment opposite and proximate to the second conductive line segment. Thereafter, current flowing through the main conductive line segment and the second conductive line segment induces magnetic fields that are additive at the coil-less sensor.

DETAILED DESCRIPTION

This description and the accompanying drawings illustrate exemplary embodiments of the present disclosure and should not be taken as limiting, with the claims defining the scope of the present disclosure, including equivalents. Various mechanical, compositional, structural, electrical, and operational changes may be made without departing from the scope of this description and the claims, including equivalents. In some instances, well-known structures and techniques have not been shown or described in detail so as not to obscure the disclosure. Further, elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

Figure 1:
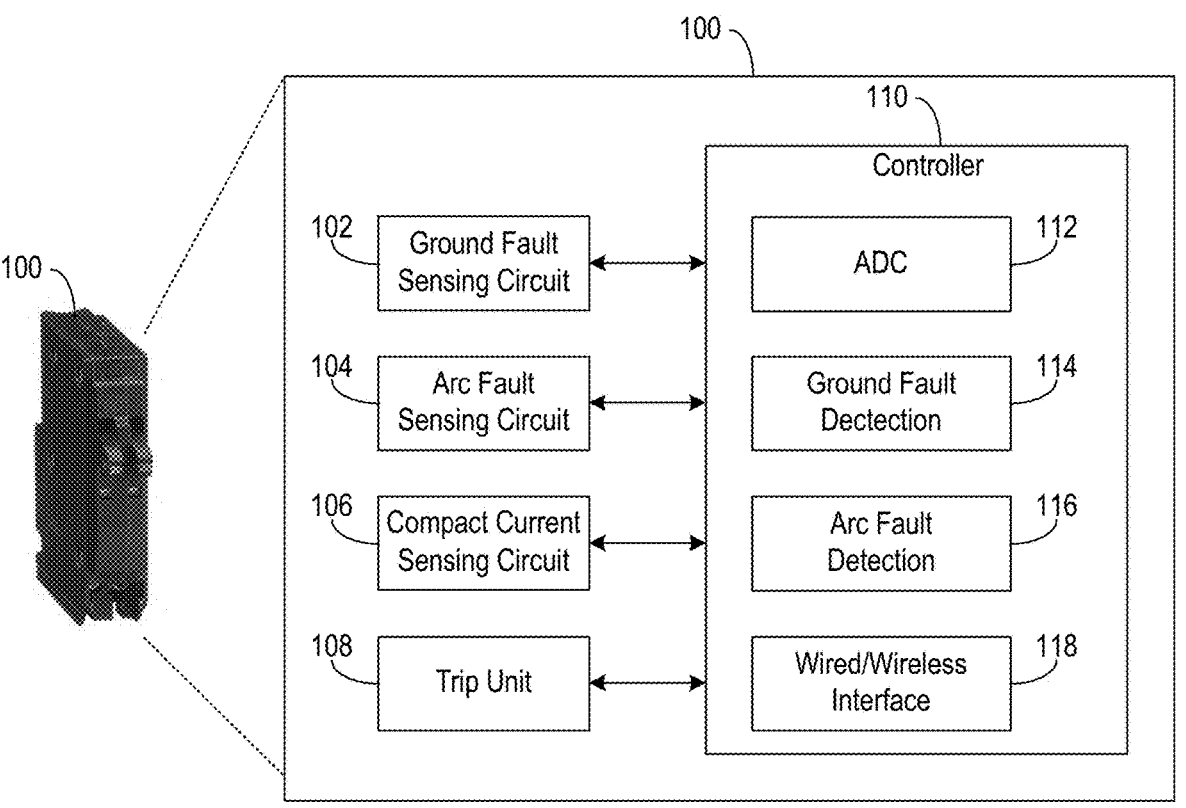
FIG. 1 is a block diagram illustrating an exemplary current flow monitoring device that uses a compact current sensing circuit according to embodiments of the present disclosure.

Referring now to FIG. 1, a block diagram is shown for an exemplary current flow monitoring device 100 that uses a compact current sensing circuit according to embodiments of the present disclosure. The current flow monitoring device 100 in this example is a double-pole electronic circuit breaker 100 that is designed to monitor current flow and provide ground fault (GFCI) and/or arc fault (AFCI) protection. To this end, the breaker 100 includes a number of functional components or modules, some of which are represented here as blocks, that are discussed further below. It will be understood, of course, that each block shown here (and in subsequent figures) may be divided into several constituent blocks, or two or more blocks may be combined into a single block, within the scope of the present disclosure.

As can be seen, the breaker 100 includes a ground fault sensing circuit 102, an arc fault sensing signal 104, a compact current sensing circuit 106, and a trip unit 108, in communication with a controller 110. The controller 110 is typically a microcontroller unit (MCU) and typically has at least one analog-to-digital converter (ADC) 112, a ground fault detection module 114, an arc fault detection module 116, and a wired and/or wireless interface module 118 therein. It is also possible for the ADC 112 to be a separate component from the controller 110 in some embodiments. Other functional components and modules not expressly shown may also be included within the scope of the present disclosure. Likewise, one or more of the expressly shown functional components or modules may be removed without departing from the present disclosure.

Operation of the breaker 100 is generally well known in the art and therefore only a brief description is provided herein. In general, the controller 110 receives input signals from the ground fault sensing circuit 102, arc fault sensing circuit 104, compact current sensing circuit 106, and other circuits that can sense mains AC current or voltage in a line conductor (not expressly shown) of the breaker 100. These signals are sampled by the ADC 112 at a certain sampling rate that is sufficiently high for purposes of various functions provided by the breaker 100. The ADC 112 converts each sample into a numerical value that is proportional to an amplitude of the sample and outputs these values to other components and modules in the controller 110. This data is then processed in a known manner by the controller 110 to monitor for occurrence of a fault condition, such as a ground fault, arc fault, short-circuit, and so forth. Upon detecting a fault condition, the controller 110 issues a trip signal to the trip unit 108 that causes the trip unit 108 to immediately shut off current flow through the breaker 100.

Figure 2A:
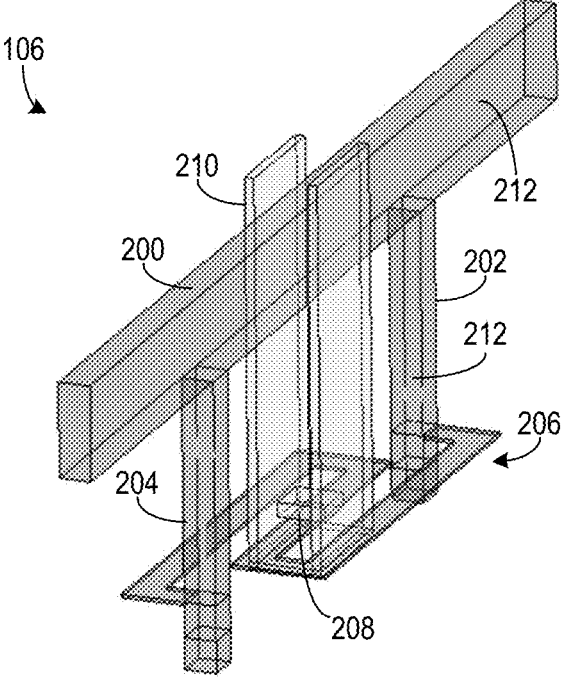
FIGS. 2A and 2B are schematic diagrams illustrating an exemplary compact current sensing circuit according to embodiments of the present disclosure.
Figure 2B:
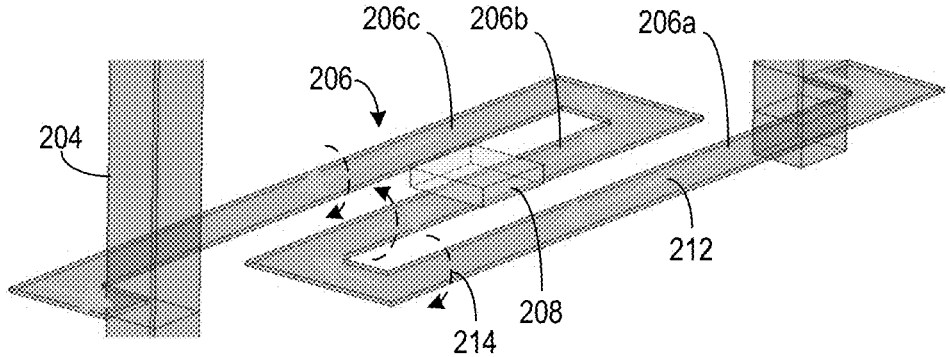

FIGS. 2A and 2B are perspective views showing an example of the compact current sensing circuit 106 according to embodiments of the present disclosure. In the depicted example, the compact current sensing circuit 106 includes a first or main conductive line segment 200, a pair of conductive shunt arms 202 and 204, and a second conductive line segment 206. The conductive shunt arms 202 and 204 conductively couple the main conductive line segment 200 to the second conductive line segment 206, such that current can flow from the main conductive line segment 200 through the second line segment 206 and back to the main conductive line segment 200.

The main conductive line segment 200, although not expressly shown, is connected to a mains AC line within the breaker 100 so as to carry mains AC current therein, as indicated by the solid arrow lines 212. The second line segment 206 extends between the shunt arms 202 and 204 so as to carry mains AC current in electrical parallel to the main conductive line segment 200, as also indicated by the solid arrow lines 212. A coil-less sensor 208 is positioned and mounted in the space between the main and second line segments 200 and 206 proximate to the second line segment 206.

Figure 3A:
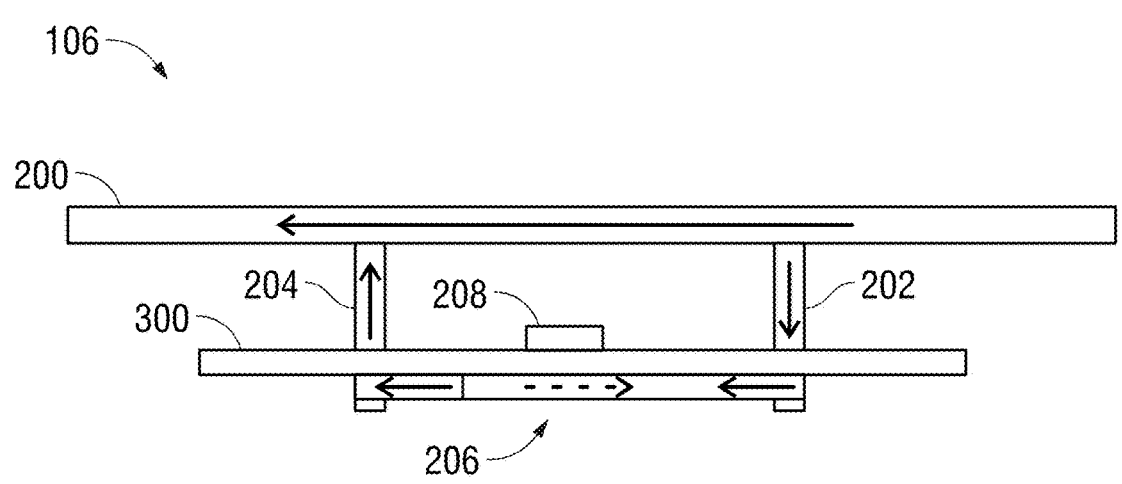
FIGS. 3A and 3B are schematic diagrams illustrating the exemplary compact current sensing circuit in more detail according to embodiments of the present disclosure.
Figure 3B:
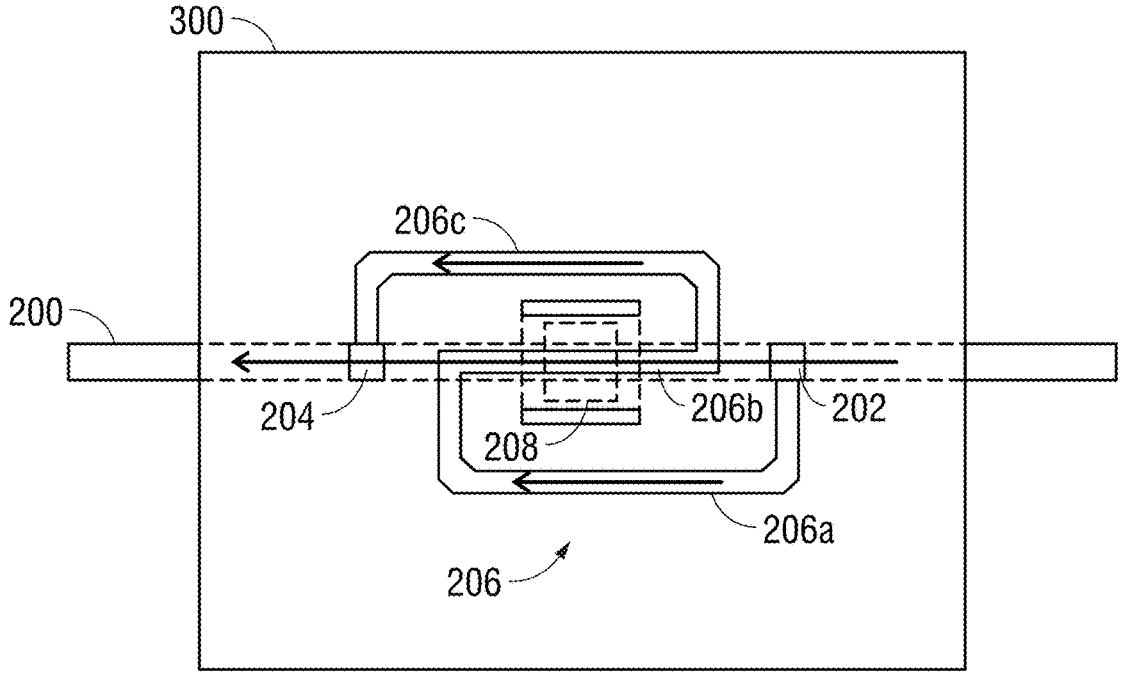

In some embodiments, the first or main conductive line segment 200 may be a bus bar, and the second line segment 206 may be a conductive trace (e.g., copper) on a printed circuit board (PCB) (seen in FIGS. 3A and 3B). In these embodiments, the conductive trace 206 is a generally planar trace formed on one side of the PCB, while the coil-less sensor 208 is mounted on the other side of the PCB generally opposite the conductive trace 206. The bus bar 200 extends in electrical parallel to the conductive trace 206 above the sensor 208, when viewed from the sensor 208.

The coil-less sensor 208 may be any commercially available coil-less sensor that is suitable for a given application. As mentioned earlier, any sensor that does not require a coil to detect current may be used as the coil-less sensor 208, including Hall effect sensors, tunneling magneto resistive ("TMR") sensors, anisotropic magneto resistive ("AMR") sensors, and similar types of sensors. Examples of suitable commercially available TMR sensors may be obtained from a number of coil-less sensor manufacturers, such as Crocus Technology, Inc. of Milpitas, California, USA, Infineon technologies AG of Neubiberg, Germany, and others. These TMR sensors are typically low-profile surface mount devices measuring about 3 mm×3 mm, which allows for particularly compact applications.

In some embodiments, the conductive trace 206 may have a shape that resembles a letter "S" (or a backward "S," depending on viewpoint), such that the middle leg 206*b* of the "S" carries current in physical parallel to, but in an opposite direction from, current in the bus bar 200. This results in a magnetic field being induced by current in the middle leg 206*b* that has an opposite direction from magnetic fields induced by current in the other two legs 206*a* and 206*c*, as indicated by the dashed arrow lines 214, in accordance with the right-hand rule of magnetic field induction.

In some embodiments, magnetic shielding 210 may be installed on the compact current sensing circuit 106 to reduce electromagnetic noise. The magnetic shielding 210 may have a shape generally resembling a letter "U" in some embodiments, such as an opened-top rectangular or oval shape, or shapes with closed or partially closed tops, and may be attached to the PCB so that bus bar 200, middle leg 206*b* of the conductive trace 206, and the coil-less sensor 208 are within the shielding 210 in some embodiments. Such shielding 210 may be made of a suitable high permeability material that can help block external magnetic fields from reaching the bus bar 200, middle leg 206*b* of the conductive trace 206, and the coil-less sensor 208. The specific dimensions and spacing of the shielding 210 may be selected as needed depending on the particular requirements of a given application.

FIGS. 3A and 3B are side and bottom views, respectively, showing the exemplary compact current sensing circuit 106 in further detail according to embodiments of the present disclosure. As can be seen here, the conductive trace 206 is formed (e.g., by etching, lithography, etc.) on one side of a PCB 300 and the coil-less sensor 208 is mounted on the other side of the PCB 300 generally opposite the conductive trace 206 in some embodiments. More specifically, the coil-less sensor 208 is disposed on the PCB 300 generally opposite the middle leg 206*b* of the conductive trace 206 so as to optimize exposure to the magnetic field induced by current in that leg 206*b*. The bus bar 200 is likewise positioned above the coil-less sensor 208 in physical parallel to the middle leg 206*b* of the conductive trace 206. As before, the specific dimensions and spacing of the bus bar 200, conductive trace 206, and coil-less sensor 208 may be selected as needed depending on the particular requirements of the given application.

Figures 4A, 4B, 4C:
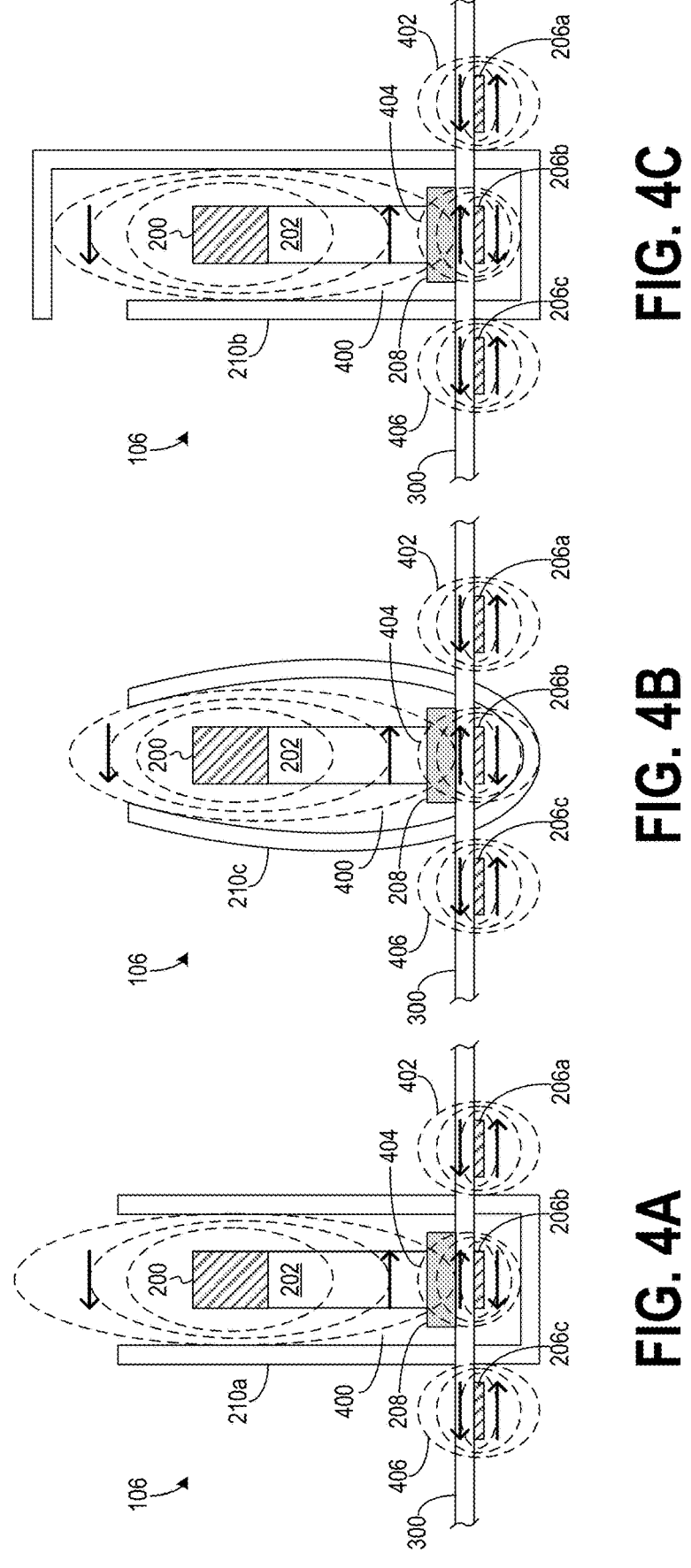
FIGS. 4A-4C are schematic diagrams illustrating magnetic fields and magnetic shielding for the exemplary compact current sensing circuit according to embodiments of the present disclosure.

FIGS. 4A-4C are cross-sectional front views showing the magnetic fields generated by the various components of the compact current sensing circuit 106 and exemplary shielding that may be used therewith according to embodiments of the present disclosure. In these figures, magnetic field lines are represented by the dashed oval lines and the direction of each magnetic field is indicated by the solid arrow lines, respectively. Thus, magnetic field lines 400 represent a magnetic field induced by current in the bus bar 200, while magnetic field lines 402, 404, and 406 represent magnetic fields induced by currents in each leg 206*a*, 206*b*, and 206*c*, respectively, of the conductive trace 206. As the solid arrow lines show, the magnetic field lines 400 for the magnetic field induced by current in the bus bar 200 and the magnetic field lines 404 for the magnetic field induced by current in the middle leg 206*b* are additive at the coil-less sensor 208.

The above arrangement causes the coil-less sensor 208 to produce a higher output voltage in response to the two additive magnetic fields 400 and 404 compared to a single magnetic field from either the bus bar 200 or any leg 206*a*, 206*b*, or 206*c* of the conductive trace 206 alone, thereby improving overall sensing accuracy. In addition, magnetic shielding may be provided to help block external magnetic fields from reaching the bus bar 200, middle leg 206*b* of the conductive trace 206, and the coil-less sensor 208, thereby further improving overall sensing accuracy. As mentioned earlier, the magnetic shielding may have any suitable shape, including shapes generally resembling a letter "U" in some embodiments, such as an opened-top rectangular shape 210*a* (FIG. 4A), or an opened-top oval shape 210*b* (FIG. 4B), or the shielding may have a closed or partially closed-top shape 210*c* (FIG. 4C), depending on the particular application. The output voltage from the coil-less sensor 208 may then be processed and provided to the controller 110 (seen in FIG. 1) of the breaker 100 to monitor current flow in the breaker.

FIGS. 5A-5D are schematic diagrams showing examples of the disclosed compact current sensing circuit being used in current flow monitoring devices. In these figures and other figures, L and L' indicate main line and second line, respectively, while L1 and L2 are the different phases of a two-phase current source, and N indicates neutral line.

Figure 5A:
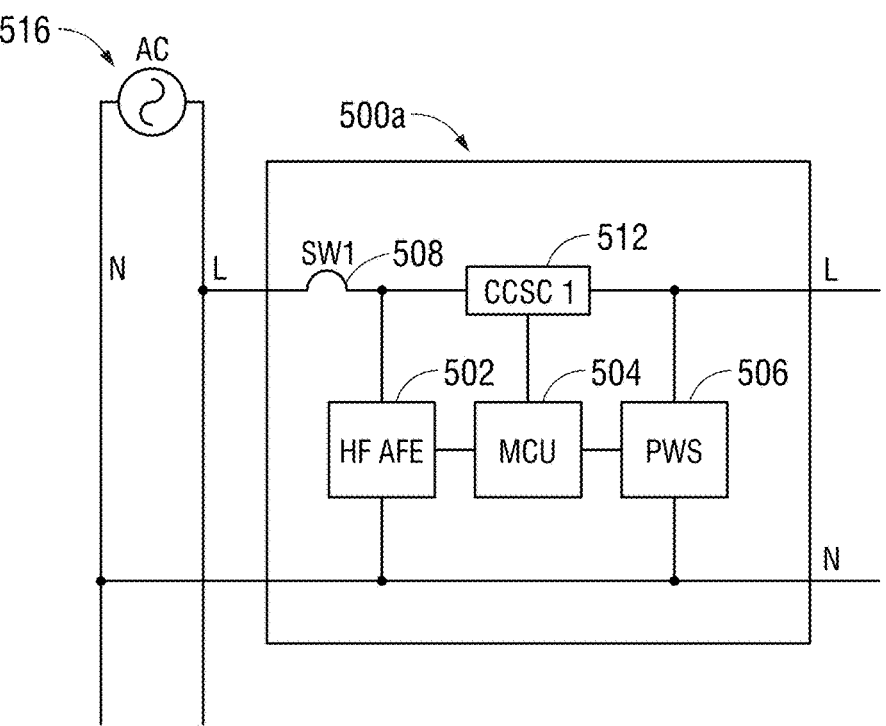
FIGS. 5A-5D are schematic diagrams illustrating exemplary current flow monitoring devices employing the exemplary compact current sensing circuit according to embodiments of the present disclosure.

Referring first to FIG. 5A, an exemplary circuit breaker 500a is shown in which the compact current sensing circuit ("CCSC") disclosed herein may be used. The circuit breaker 500a is a typical single-pole circuit breaker that includes a high-frequency analog front end 502, a microcontroller unit 504, and a power supply 506, among other components. These components and their operation are generally well known to those having ordinary skill in the art and thus a detailed description is omitted here. Mains AC current is provided to the breaker 500a from a public utility or other suitable AC current source 516 through a switch or relay 508. In accordance with embodiments of the present disclosure, the mains AC current is sensed using a compact current sensing circuit 512 that operates as shown and described earlier herein. The output voltage from the sensor circuit 512 is then provided to the microcontroller unit 504 to monitor current flow in the breaker 500 in a known manner.

Figure 5B:
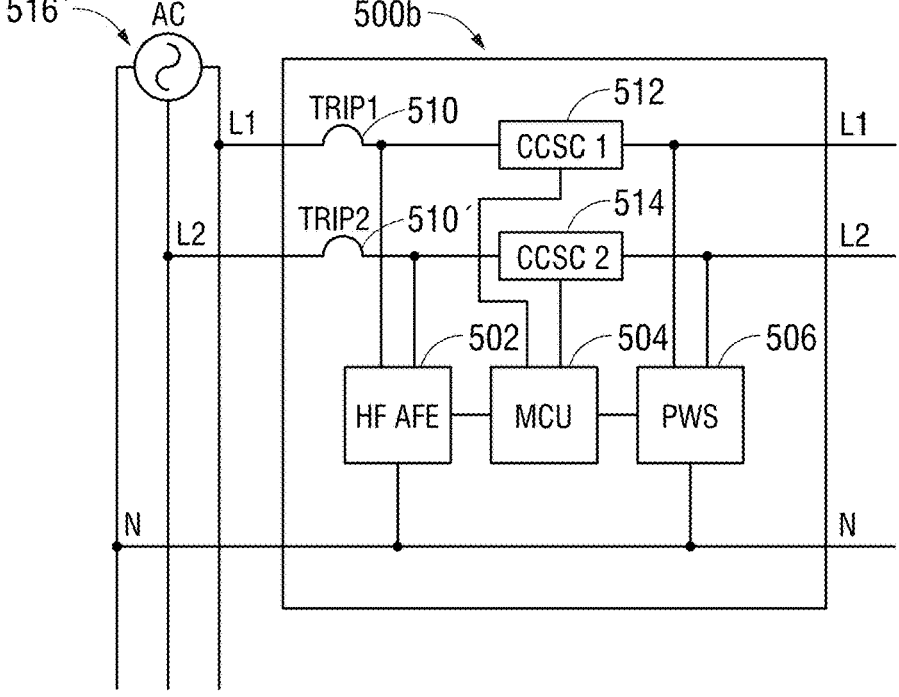

FIG. 5B illustrates an example of the compact current sensing circuit disclosed herein being used with a double-pole circuit breaker 500b. The double-pole circuit breaker 500b, like its single-pole counterpart 500a in FIG. 5A, has a high-frequency analog front end 502, a microcontroller unit 504, and a power supply 506, among other components. In this example, mains AC current is provided to the two poles from a two-phase AC current source 516' through two trip latches 510 and 510', respectively. The AC current flow through the two trip latches 510 and 510' is sensed using two compact current sensing circuits 512 and 514, respectively, one for each pole, as shown. The output voltages from each sensor circuit 512 and 514 are then provided to the microcontroller unit 504 to monitor the current flow.

Figure 5C:
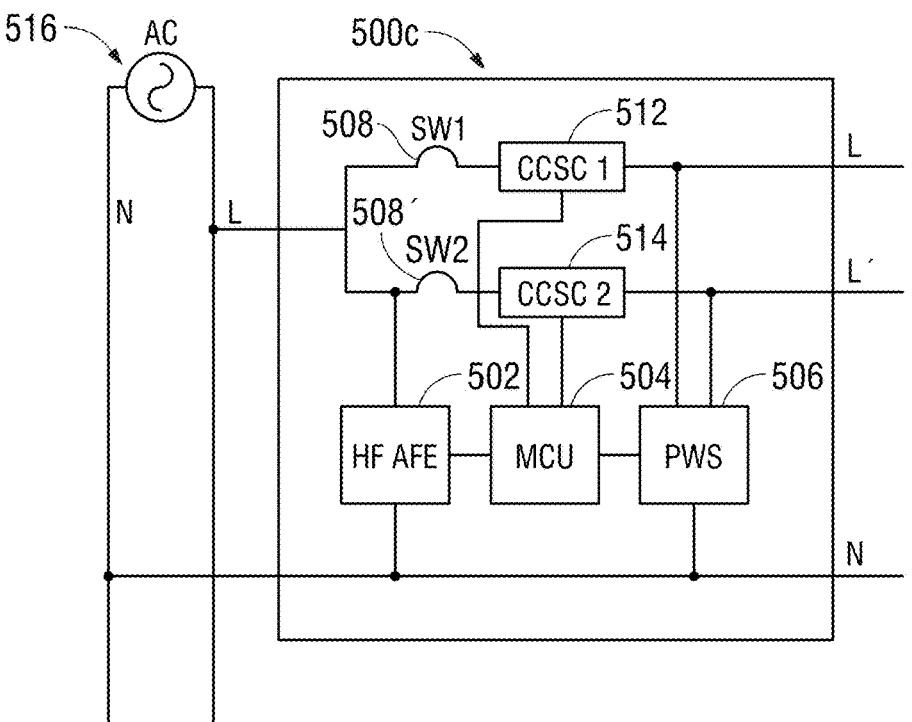

FIG. 5C illustrates an example of the compact current sensing circuit disclosed herein being used with another double-pole circuit breaker 500c. The double-pole circuit breaker 500c here is similar to the double-pole circuit breaker 500b in FIG. 5B, except that in this example, AC current from a mains AC current source 516 flows through two switches or relays 508 and 508', respectively. The AC current flow through the two switches or relays 508 and 508' is again sensed using two compact current sensing circuits 512 and 514, respectively, one for each pole. The output voltages from each sensor circuit 512 and 514 are then provided to the microcontroller unit 504 four monitoring purposes.

Figure 5D:
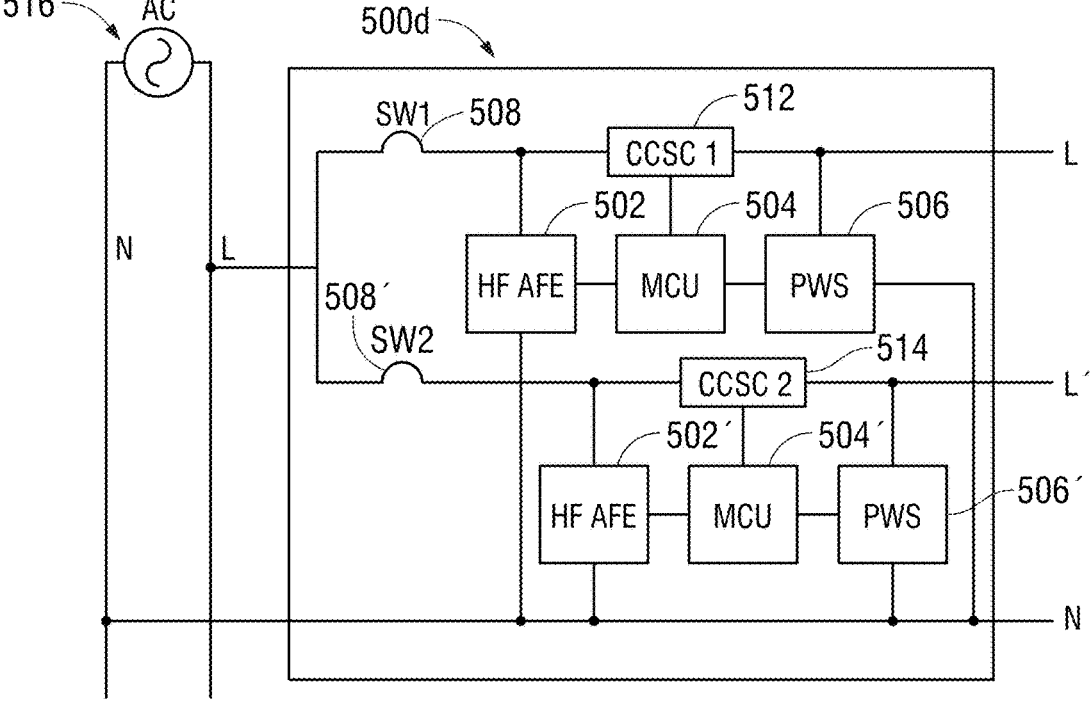

FIG. 5D shows an alternative circuit breaker 500d in which the compact current sensing circuit disclosed herein may be used. This circuit breaker 500d is also a double-pole circuit breaker, but includes a separate set of components for each pole, respectively. Thus, the circuit breaker 500d has two high-frequency analog front ends 502 and 502', two microcontroller units 504 and 504', and two power supplies 506 and 506', among other components. As before, these components and their operation are generally well known to those having ordinary skill in the art and a detailed description is omitted for economy. Mains AC current from an AC current source 516 is again provided to each pole of the breaker 500d through two switches or relays 508 and 508', respectively. The mains AC current is again sensed using two compact current sensing circuits 512 and 514, one circuit for each pole, respectively. The output voltages from each sensor circuit 512 and 514 are then provided to the microcontroller units 504 and 504' to the monitor current flow.

Figure 6:
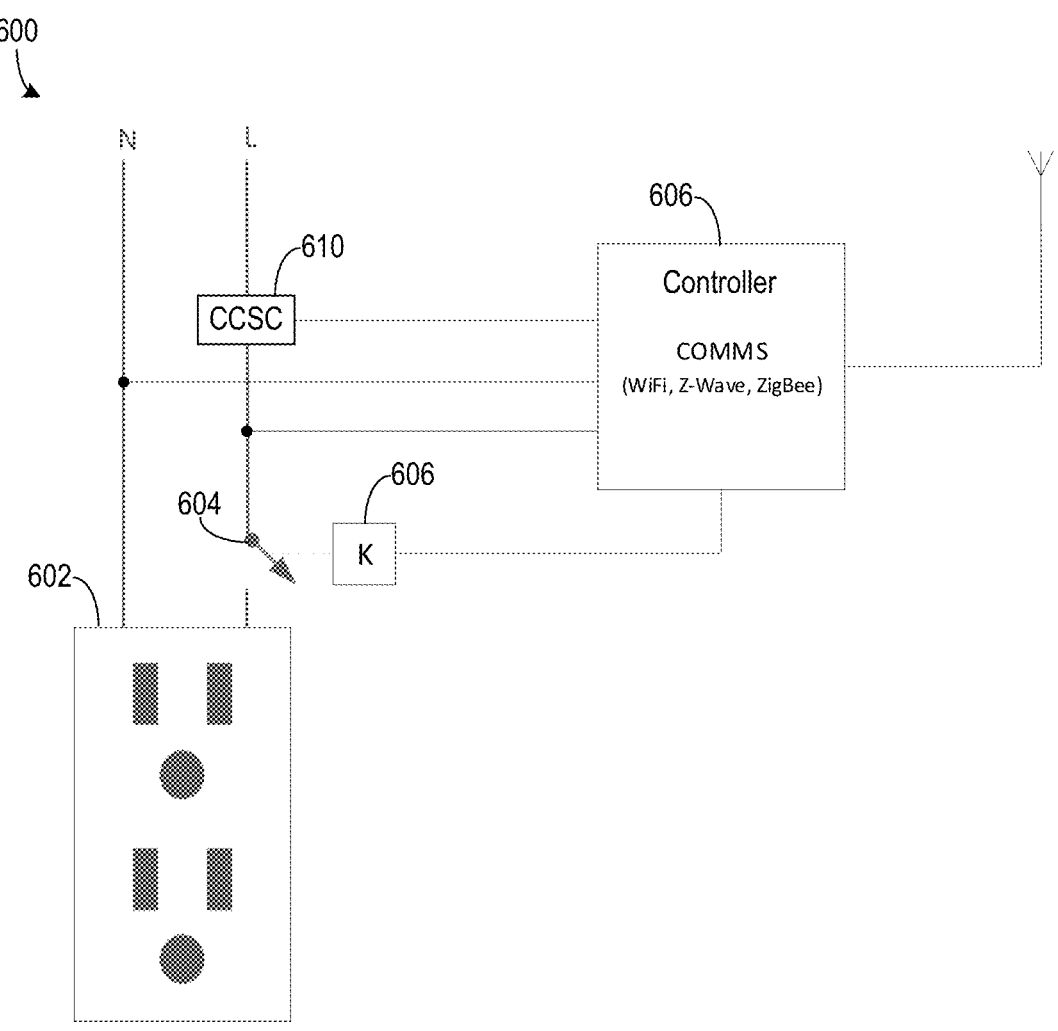
FIG. 6 is a schematic diagram illustrating another exemplary current flow monitoring device employing the exemplary compact current sensing circuit according to embodiments of the present disclosure.

FIG. 6 is a schematic diagram showing an example of the compact current sensing circuit disclosed herein being used in another current flow monitoring device 600. The current flow monitoring device 600 in the FIG. 6 example is a wiring device 600 composed of an electrical socket 602 of the kind commonly used to plug in various electrical appliances. Mains AC current is supplied via a branch circuit (not expressly shown) through a switch or relay 604 that is operated by a relay unit 606. The relay unit 606 is in turn controlled by a controller 606 that monitors the flow of current through the socket 602. In accordance with embodiments of the present disclosure, the flow of current is sensed using a compact current sensing circuit 610 as shown and described herein. The output voltage from each sensor circuit 610 is then provided to the controller 606 to monitor current flow through the socket 602.

A number of other advantages are also provided by the embodiments of the present disclosure. For example, in existing designs, both RSSI (Receiver Signal Strength Indicator) and line current are typically connected to a di/dt sensor. However, embodiments described herein can be used to allow the RSSI to be captured from the voltage between the line (L) and neutral (N), or from a low impedance path between L and N for high frequency (HF) signals created from the branch circuit. That is, the compact current sensing circuit disclosed herein can be used to obtain line current from a coil-less sensor (e.g., TMR sensor). This provides a compact design for current AFCI devices. For tandem devices, a single RSSI signal path and two sensors may be used that can measure the current from two different bus bars and mechanical subassemblies. This allows for a simplified design where a single microcontroller is used and the same AFD algorithm configured for two-pole is utilized. Also, both line currents are isolated so isolation circuitry is not required. This also allows for more available space to be used for other sensors, such as a ground fault (GF) sensor, or communication circuitry. In wiring devices, energy monitoring components that typically require a shunt sensor and high sensitivity ADCs may be replaced with a coil-less sensor that can provide the current measuring signals to the communications controller, thus providing a cost savings over existing design.

Figure 7:
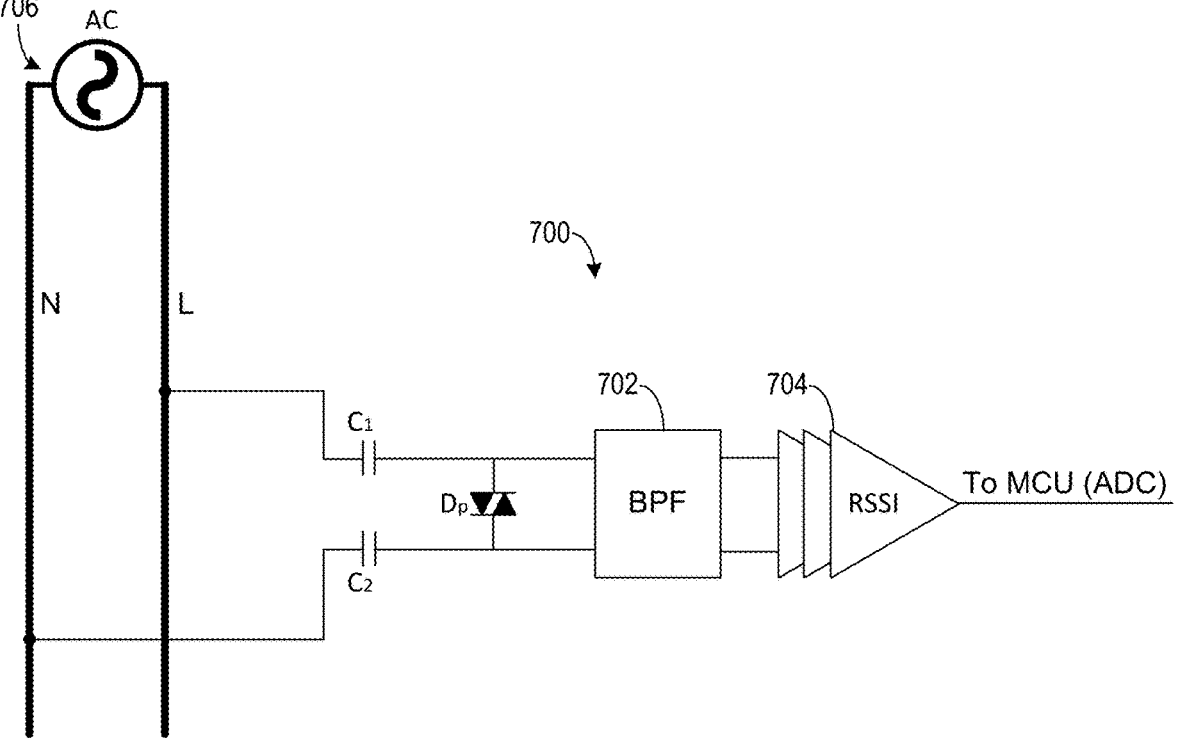
FIG. 7 is a schematic diagram illustrating an exemplary received signal strength indicator (RSSI) circuit that may be used with the exemplary compact current sensing circuit according to embodiments of the present disclosure.

FIG. 7 illustrates an example of an RSSI circuit 700 that may be used in a current flow monitoring device to capture RSSI from the voltage between the line (L) and neutral (N). The RSSI circuit 700 in this exampled is composed of a bandpass filter 702 and a voltage amplifier 704, connected as shown. In some embodiments, one of the inputs to the bandpass filter 702 is provided by line (L) through capacitor C1, while the other input to the bandpass filter 702 is provided by neutral (N) through a second capacitor C2. Capacitors C1 and C2 may have roughly equal capacitance in some embodiments. A diode arrangement Dp composed of two diodes coupled in reverse parallel may be connected across the inputs of the bandpass filter 702 to limit the voltage across the bandpass filter 702 to one diode voltage drop. The output of the bandpass filter 702 is then fed to the inputs of the voltage amplifier 704, and the output voltage from the amplifier 704 then feeds an MCU (specifically, the ADC thereof) of the current flow monitoring device. Such an RSSI circuit 700 allows the RSSI to be captured from the voltage between the line (L) and neutral (N), without requiring a separate di/dt sensor.

Figure 8:
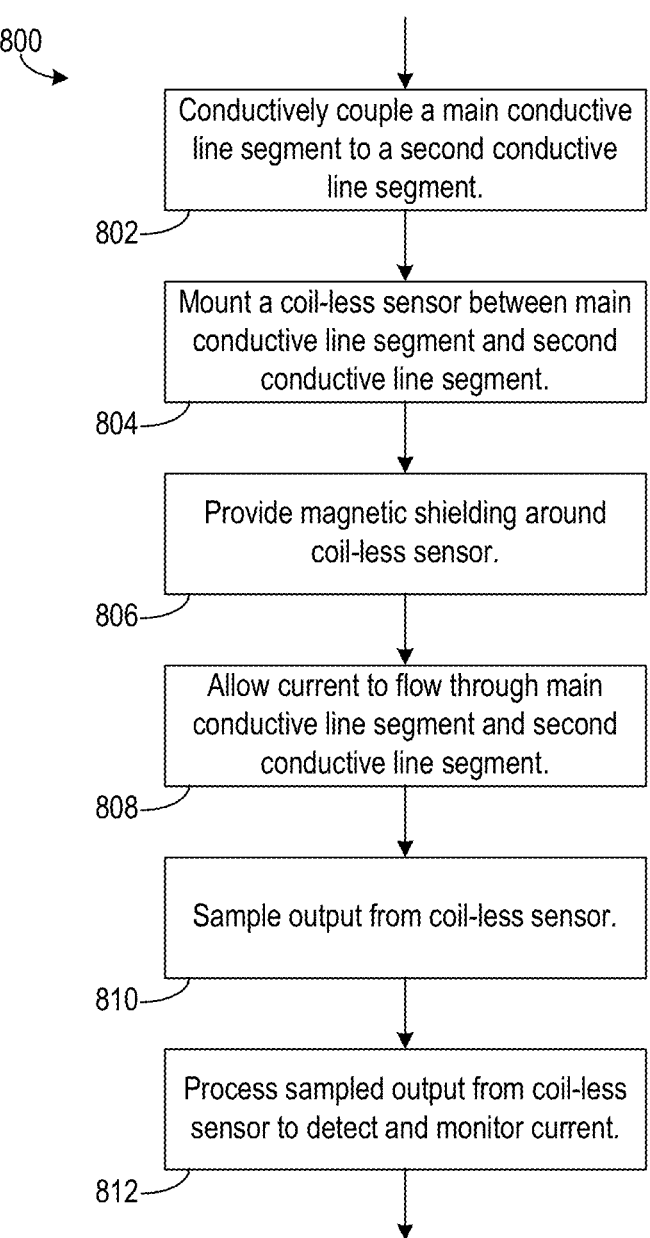
FIG. 8 is a flow diagram illustrating an exemplary method for monitoring current flow employing the exemplary compact current sensing circuit according to embodiments of the disclosure.

Referring now to FIG. 8, a flow diagram 800 is shown illustrating an exemplary method for detecting and monitoring current flow using the exemplary compact current sensing circuit described herein according to embodiments of the disclosure. The method generally begins by providing a compact current sensing circuit that can be used for detecting and monitoring the current flow. Thus, at 802, a main conductive line segment is conductively coupled to a second conductive line segment opposite and in electrical parallel to the main conductive line segment. In some embodiments the main conductive line segment may be a bus bar, and the second conductive line segment may be a conductive trace on a printed circuit board (PCB). In some embodiments, the conductive coupling may be done via a pair of conductive shunt arms that connect the main conductive line segment to the second conductive line segment At 804, a coil-less sensor is mounted between the main conductive line segment and the second conductive line segment opposite and proximate to the second conductive line segment. In embodiments where the second conductive line segment is a planar trace on a PCB, the coil-less sensor is mounted on one side of the PCB while the conductive trace is formed on the other side of the PCB generally opposite the coil-less sensor. At 806, optionally, magnetic shielding is provided around the coil-less sensor. The magnetic shielding may have a shape that generally resembles an opened-top letter "U" in some embodiments, or the shielding may be closed or partially closed. Similarly, the second conductive line segment may have a shape that resembles the letter "S" in some embodiments.

At 808, current from a mains AC current source is allowed to flow through the main conductive line segment, and hence through the second conductive line segment. The current induces magnetic fields around the main conductive line segment and the second conductive line segment. Because of the position and shape of the second conductive line segment, the magnetic field induced by current in the middle leg the second conductive line segments adds to the magnetic field induced by current in the main conductive line segment at the coil-less sensor. The additive fields allow the coil-less sensor to produce a higher output voltage than it otherwise could, resulting in greater sensing accuracy.

At 810, the output from the coil-less sensor is sampled, for example, by an analog-to-digital converter and pre-processed (e.g., filtered, etc.). At 812 the sampled output from the coil-less sensor is provided to a controller unit, such as a microcontroller unit, that further processes the output in a known manner for monitoring and detection purposes.

Thus, as can be seen, the embodiments disclosed herein provide a number of benefits and advantages. For example, the disclosed embodiments simplify the assembly process in manufacturing, since the coil-less sensor can be populated along with other surface mount parts during PCB module assembly. Bus bar assembly is also simplified because insertion through core-based/winding sensors is not required, and the resulting improved clearance allows the bus bar to simply be welded in place. Lower cost of manufacturing can also be realized because the coil-less sensor is a true sensor and thus additional active components, such as amplifiers or integrators, are not required. The disclosed embodiments are a particularly ideal solution for AFCI and EM (electromagnetic) applications in AFCI and tandem AFCI and wiring devices where space is a major constraint. These embodiments offer a compact design in contrast to core-based sensors that increase manufacturing complexity and also require more space.

Further, the design of the PCB trace along with the bus bar assembly improves the magnetic field around the sensor, which increases the SNR (signal-to-noise ratio) and improves the sensitivity of the sensor. The PCB trace has an "S" shape as discussed above, which routes current in the opposite direction of the bus bar. This creates a magnetic field on both sides of the sensor in the same direction resulting in a magnetic field that is stronger relative to a magnetic field from the trace or the bus bar alone.

A U-shape shielding made of high permeability material allows for good cross-talk isolation from external magnetic fields with minimal to no impact on AFD (arc fault detection) or energy monitoring. This shielding prevents opposing magnetic fields created by the routing of current through adjacent parallel traces from canceling the field generated by the trace below the sensor. The shielding basically preserves a space around the sensor for the desired magnetic field to be used for current measurement.

The PCB trace and the bus bar carry current on both sides of the coil-less sensor. The bus bar carries the majority of the current, but the PCB trace is in closer proximity to the sensor. Both the bus bar and PCB trace generate a magnetic field and these fields are added toward the center of the sensor rather than canceling each other. This increases the total magnetic field created by the two current paths.

A sensor such as a TMR sensor is a true current sensor and not a di/dt sensor (e.g., a Rogowski coil). Thus, there is no need to integrate the sensor signal to derive the true current. Assembly for the bus bar and TMR sensor can be fully automated and does not require complex handling. The design of the U-shaped magnetic shielding can fully isolate any external magnetic fields and be easily integrated into the assembly process with minimal space requirements. In AFCI applications, whether using a 1-Pole/2-Pole or a tandem design, line current can be measured without the need for a di/dt sensor and associated integrator. A low pass filter is sufficient for AFD and the signal can be sampled directly with a microcontroller's ADC peripherals.

It is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein, but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

We claim:

1. A compact current sensing circuit, comprising:

a main conductive line segment;

a second conductive line segment conductively coupled to the main conductive line segment opposite and in electrical parallel to the main conductive line segment;

a pair of shunt arms conductively coupling the main conductive line segment to the second conductive line segment; and a coil-less sensor mounted between the main conductive line segment and the second conductive line segment opposite and proximate to the second conductive line segment;

wherein current flowing through the main conductive line segment and the second conductive line segment induces magnetic fields that are additive at the coil-less sensor.

2. The compact current sensing circuit according to claim 1, further comprising magnetic shielding around the coil-less sensor.

3. The compact current sensing circuit according to claim 2, wherein the magnetic shielding around the coil-less sensor has a shape that generally resembles a letter "U" or a closed or partially close rectangular shape.

4. The compact current sensing circuit according to claim 1, wherein the main conductive line segment is a bus bar.

5. The compact current sensing circuit according to claim 1, wherein the second conductive line segment is a conductive trace on a printed circuit board (PCB).

6. The compact current sensing circuit according to claim 5, wherein the conductive trace on the PCB has a shape that resembles a letter "S".

7. A method of providing a compact current sensing circuit in a current flow monitoring device, comprising:

conductively coupling a main conductive line segment to a second conductive line segment opposite and in electrical parallel to the main conductive line segment;

mounting a pair of shunt arms conductively coupling the main conductive line segment to the second conductive line segment; and mounting a coil-less sensor between the main conductive line segment and the second conductive line segment opposite and proximate to the second conductive line segment;

wherein current flowing through the main conductive line segment and the second conductive line segment induces magnetic fields that are additive at the coil-less sensor.

8. The method according to claim 7, further comprising providing magnetic shielding around the coil-less sensor.

9. The method according to claim 8, wherein the magnetic shielding around the coil-less sensor has a shape that generally resembles a letter "U" or a closed or partially close rectangular shape.

10. The method according to claim 7, wherein the main conductive line segment is a bus bar.

11. The method according to claim 7, wherein the second conductive line segment is a conductive trace on a printed circuit board (PCB).

12. The method according to claim 11, wherein the conductive trace on the PCB has a shape that resembles a letter "S".

13. A compact current sensing circuit, comprising:

a bus bar;

a printed circuit board (PCB) comprising a conductive trace conductively coupled to the bus bar opposite and in electrical parallel to the bus bar; and a coil-less sensor mounted between the bus bar and the conductive trace opposite and proximate to the conductive trace;

wherein current flowing through the bus bar and the conductive trace induces magnetic fields that are additive at the coil-less sensor.

14. The compact current sensing circuit according to claim 13, further comprising magnetic shielding around the coil-less sensor.

15. The compact current sensing circuit according to claim 14, wherein the magnetic shielding around the coil-less sensor has a shape that generally resembles a letter "U" or a closed or partially close rectangular shape.

16. The compact current sensing circuit according to claim 13, wherein the compact current sensing circuit is part of a double-pole electronic circuit breaker.

17. The compact current sensing circuit according to claim 13, wherein the coil-less sensor is mounted on the PCB.

18. The compact current sensing circuit according to claim 17, wherein the coil-less sensor and the conductive trace are on opposite sides of the PCB.

19. The compact current sensing circuit according to claim 13, wherein the conductive trace has a shape that resembles a letter "S".

20. The compact current sensing circuit according to claim 13, wherein the coil-less sensor comprises at least selected from the group consisting of a Hall effect sensor, a tunneling magneto resistive sensor and an anisotropic magneto resistive sensor.

* * * * *